(12) United States Patent
Yun

(10) Patent No.: US 7,907,466 B2
(45) Date of Patent: Mar. 15, 2011

(54) SEMICONDUCTOR MEMORY APPARATUS

(75) Inventor: Jae Woong Yun, Ichon (KR)

(73) Assignee: Hynix Semiconductor Inc. (KR)

( * ) Notice: Subject to any disclaimer, the term of this patent is extended or adjusted under 35 U.S.C. 154(b) by 446 days.

(21) Appl. No.: 12/044,857

(22) Filed: Mar. 7, 2008

(65) Prior Publication Data

US 2008/0219081 A1    Sep. 11, 2008

(30) Foreign Application Priority Data

Mar. 9, 2007   (KR) .................. 10-2007-0023485
Sep. 5, 2007   (KR) .................. 10-2007-0089894

(51) Int. Cl.
*G11C 8/00* (2006.01)
(52) U.S. Cl. .................. 365/230.03; 365/230.04
(58) Field of Classification Search .......... 365/230.03, 365/230.04, 230.06
See application file for complete search history.

(56) References Cited

U.S. PATENT DOCUMENTS

| | | | |
|---|---|---|---|
| 5,771,199 A | 6/1998 | Lee | |
| 6,310,816 B2 | 10/2001 | Manning | |
| 6,327,214 B1 * | 12/2001 | Yoon et al. | 365/230.03 |
| 6,414,868 B1 | 7/2002 | Wong et al. | |
| 7,257,020 B2 * | 8/2007 | Hidaka | 365/171 |
| 2004/0032776 A1 | 2/2004 | Kim et al. | |
| 2006/0018168 A1 | 1/2006 | Kim | |
| 2008/0123461 A1 * | 5/2008 | Kim et al. | 365/230.03 |

FOREIGN PATENT DOCUMENTS

| | | |
|---|---|---|
| JP | 2003-143240 | 5/2003 |
| JP | 2005056529 | 3/2005 |
| JP | 2005-317124 | 11/2005 |
| KR | 1019990013547 | 2/1999 |
| KR | 1019990040435 | 6/1999 |
| KR | 1020010047329 | 6/2001 |

* cited by examiner

*Primary Examiner* — Vu A Le
(74) *Attorney, Agent, or Firm* — Baker & McKenzie LLP

(57) ABSTRACT

A semiconductor memory apparatus includes first and second data storing/processing sections that have memory areas in a bank and the first and second data storing/processing sections share a circuit block that inputs and outputs the data, and a signal line that transmits the data.

9 Claims, 5 Drawing Sheets

SEMICONDUCTOR MEMORY APPARATUS

CROSS-REFERENCE TO RELATED PATENT APPLICATION

This application claims the benefit under 35 U.S.C. 119(a) of Korean Patent Application No. 10-2007-0023485, filed on Mar. 9, 2007, and Korean Patent Application No. 10-2007-0089894, filed on Sep. 5, 2007, in the Korean Intellectual Property Office, the disclosure of which is incorporated herein in its entirety by reference as if set forth in full.

BACKGROUND

1. Technical Field

The embodiments described herein relate to a semiconductor circuit technology, in particular, to a semiconductor memory apparatus that easily produces a design model and increases the layout margin.

2. Related Art

The storage capacities of conventional semiconductor memory apparatus, such as SDR (Single Data Rate DRAM), DDR (Double Data Rate DRAM), DDR2, and DDR3, are increasing. Further, the data processing speeds are also increasing.

As these conventional semiconductor technologies, e.g., SDR, DDR, DDR2, and DDR3 are developed, the number of data bits that are read from or written to the memory cells corresponding to a single column during a single operation doubles. The column operation refers to the operation that selects a bit line crossing the activated word line and reads and writes data thereon.

Since the number of bit doubles so as to correspond to the column operation, signal lines through which data is input and output and the circuit components for controlling the column operation correspondingly double.

A conventional semiconductor memory apparatus includes a memory cell that consists of transistors connected to bit lines and word lines, a bank that consists of circuits for reading data from and writing data to the memory cell, and a peripheral circuit that inputs data from outside the semiconductor memory apparatus into the bank and outputs data from the bank to the outside.

The number of banks varies depends on the memory capacity of the semiconductor memory apparatus.

For example, a conventional semiconductor memory apparatus, e.g., an X16 DDR3, has one bank that is divided into eight small sections Octet0 to Octet7, as shown in FIG. 1.

The eight small sections Octet0 to Octet7 have the same configuration. For example, Octet0 includes a cell area 11, a column control unit 12, and an IO sense amplifier (hereinafter, referred to as IOSA) 13.

The column control unit 12 receives a column control signal YAE to generate a column selection signal CY<i>.

The IOSA 13 detects and amplifies data of a local IO line LIOT/LIOB and outputs the data through a global IO line GIO_0.

The operation of such a conventional semiconductor apparatus will be described with reference to FIG. 2.

When a read command Read is input, the column control signal YAE is generated after a predetermined time.

The column control units 12 of the small sections Octet0 to Octet7 delays the column control signal YAE by a predetermined time, and output the column selection signal CY<i> to the individual cell areas 11.

Data that is stored in the cell areas 11 of the small sections Octet0 to Octet7 are simultaneously transmitted to the individual global IO line GIO_0 to GIO_7 through the local IO lines LIOT/LIOB and IOSA 13.

The data of the global IO lines GIO_0 to GIO_7 is output to the outside of the semiconductor memory apparatus through pads PAD (not shown), on the basis of the strobe signal DQS.

In such a conventional semiconductor apparatus, each of eight small sections Octet0 to Octet7 includes a local IO line LIOT/LIOB, a column control unit 12 and an IO sense amplifier 13. Further, the global IO lines are provided individually for every small section Octet0 to Octet7.

As described above, a conventional semiconductor memory apparatus necessarily includes a signal line and a column control unit for every small section, which makes the circuit design and the layout design be difficult. Further, as the semiconductor memory technologies develop, larger memory capacity is required along with faster data processing performance using circuits that occupy smaller than or equal to the same area required in conventional apparatus. Therefore, the difficulty in the circuit design and the layout design may become worse.

SUMMARY

A semiconductor memory apparatus that easily produces a design model and increases the layout margin is described herein.

According to one aspect, a semiconductor memory apparatus includes first and second data storage/processing sections that separately include memory areas in banks. The first and second data storage/processing sections share a circuit that inputs and outputs data and a signal line that transmits data.

According to another aspect, a semiconductor memory apparatus includes: a memory bank that is divided into a plurality of small sections, data input/output circuits that are shared by small section pairs each consisting of two small sections of plurality of small sections, and input and output the data of the small section pairs, and signal lines that are shared by the small section pairs, and transmit the data from the small section pair into the data input/output circuit or outside the memory bank.

BRIEF DESCRIPTION OF THE DRAWINGS

Features, aspects, and embodiments are described in conjunction with the attached drawings, in which.

DETAILED DESCRIPTION

Figure 1:
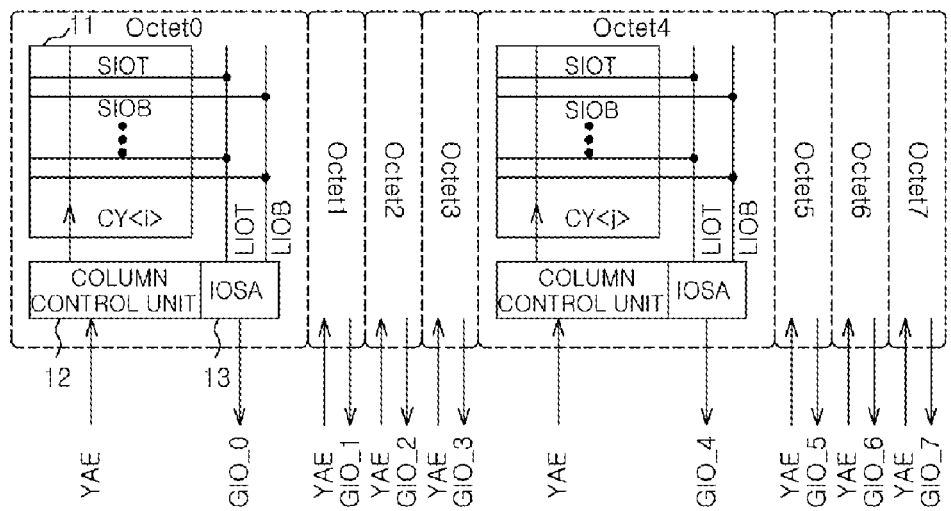
FIG. 1 is a block diagram illustrating a conventional semiconductor memory apparatus.
Figure 2:
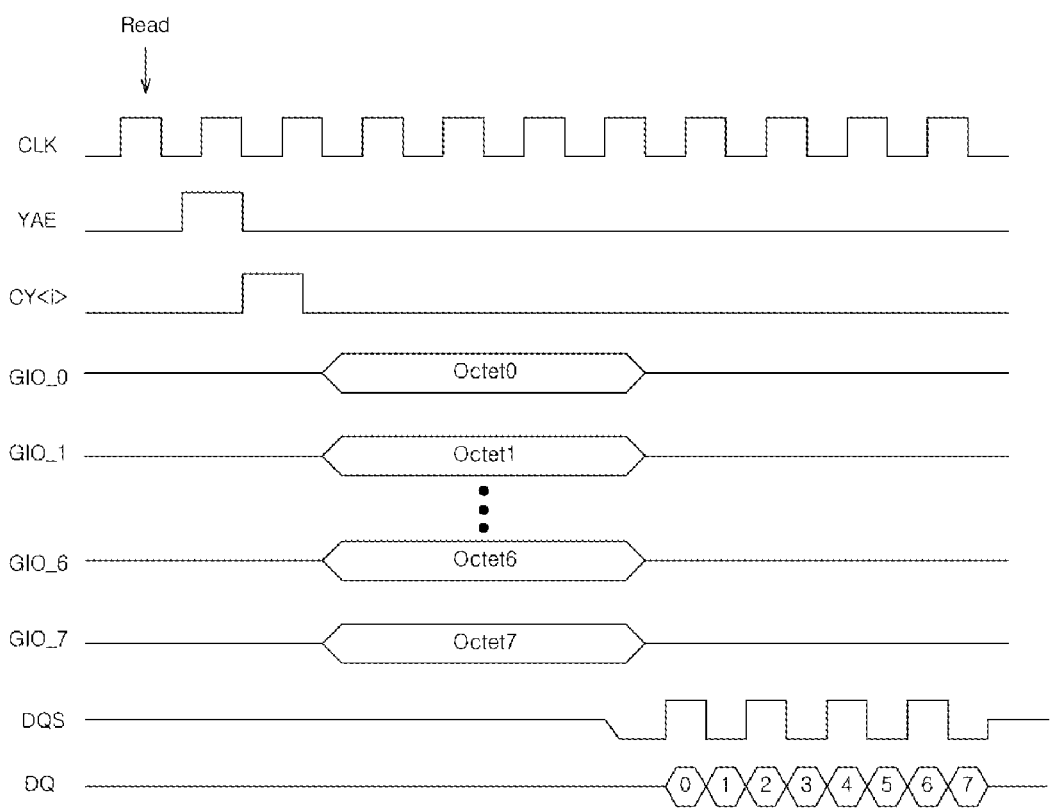
FIG. 2 is an operation timing chart illustrating the operation of the semiconductor memory apparatus of FIG. 1.
Figure 3:
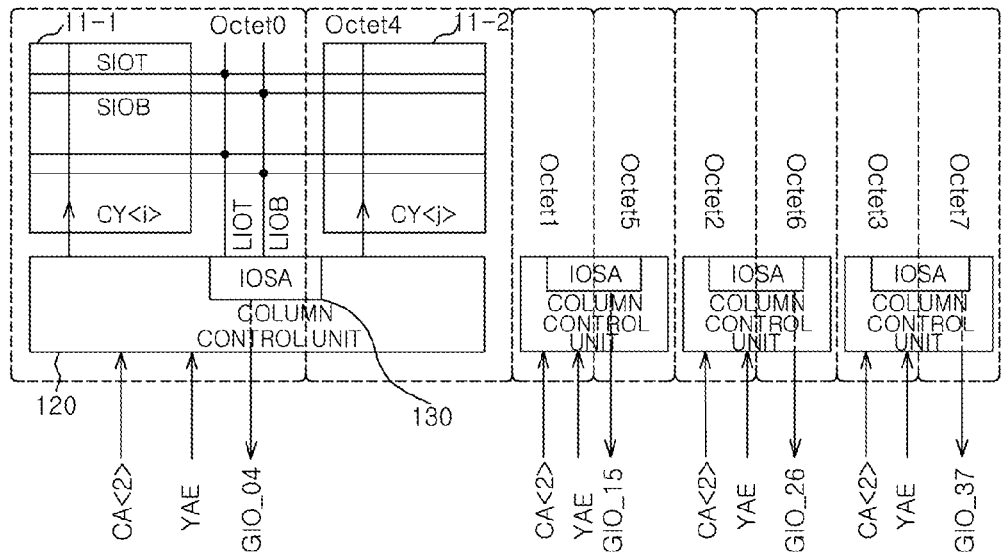
FIG. 3 is a block diagram illustrating a semiconductor memory apparatus according to one embodiment.

Referring to FIG. 3, a semiconductor memory apparatus according to one embodiment includes a bank, which is divided into eight small sections Octet0 to Octet7.

The small sections are organized in pairs and the small sections of every pair share a local IO line LIOT/LIOB, a column control unit 120, an IOSA 130, and a global IO line GIO_04 GIO_15, GIO_26 and GIO_37.

The two small sections that make a pair are referred to as a small section pair. Since the number of small sections Octet0 to Octet7 is eight, the small sections are arranged with this order, Octet0, Octet4, Octet1, Octet5, Octet2, Octet6, Octet3, and Octet7. The small section pairs are composed of two adjacent small sections, and defined as first to fourth small section pairs Octet0/Octet4, Octet1/Octet5, Octet2/Octet6, and Octet3/Octet7.

In order to form one pair by two of eight small sections Octet0 to Octet7, the two small sections that form the pair need to have a timing difference of two clocks when reading or writing data in the two small sections. The specification of DDR3 DRAM has a timing difference of two clocks when reading or writing data in every two small sections of the first to fourth small section pairs Octet0/Octet4, Octet1/Octet5, Octet2/Octet6, and Octet3/Octet7. Therefore, the first to fourth small section pairs are defined as Octet0/Octet4, Octet1/Octet5, Octet2/Octet6, and Octet3/Octet7.

The reference symbols of the global IO lines GIO_04 GIO_15, GIO_26 and GIO_37 are named after the small sections that share the corresponding global IO line. For example, the global IO line GIO_04 is named based on the number 0 of the small section Octet0 and the number 4 of the small section Octet4.

The global IO lines GIO_04, GIO_15, GIO_26, and GIO_37 are connected to IO sense amplifiers 130 of the first to fourth small section pairs Octet0/Octet4, Octet1/Octet5, Octet2/Octet6, and Octet3/Octet7.

Since the first to fourth small section pairs Octet0/Octet4, Octet1/Octet5, Octet2/Octet6, and Octet3/Octet7 have the same configuration, the configuration of the first small section pair Octet0/Octet4 will be described hereinafter as a representative.

The first small section pair Octet0/Octet4 includes first and second cell areas 11-1 and 11-2, a local IO line LIOT/LIOB, a column control unit 120, and an IOSA 130.

The local IO line LIOT/LIOB is connected with both internal IO lines SIOT/SIOB of the first small section pairs Octet0/Octet4.

The IOSA 130 is connected to the local IO line LIOT/LIOB and detects and amplifies the data of the local IO line LIOT/LIOB and then transmits the data to the global IO line GIO_04.

The column control unit 120 receives a column control signal YAE and a column address CA<2> and generates first and second column selection signals CY<i> and CY<j> at different times. The column address CA<2> is used to select one of the small sections Octet0 to 3 and the small sections Octet 4 to 7. Specifically, if the small sections Octet0 to 3 are selected, the column address CA<2> is in a low level (a logical value is 0). Otherwise, if the small sections Octet4 to 7 are selected, then the column address CA<2> is in a high level (a logical value is 1).

Figure 4:
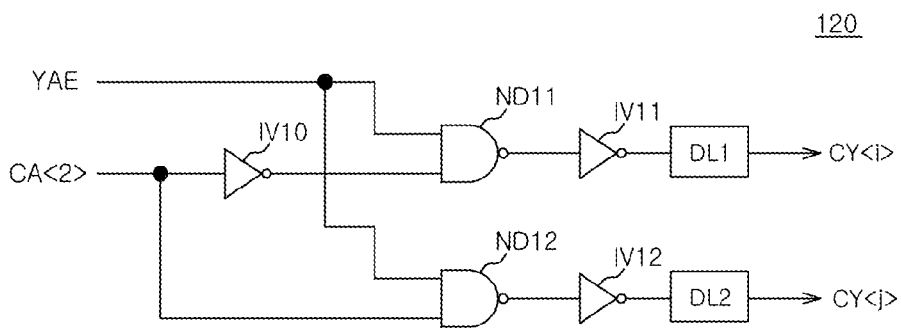
FIG. 4 is a circuit diagram illustrating a column control unit included in the apparatus of FIG. 3.

As shown in FIG. 4, the column control unit 120 includes a first inverter IV10 that receives a column address CA<2>, a first NAND gate ND10 that receives the column control signal YAE and an output of the first inverter IV10, a second inverter IV11 that receives an output of the first NAND gate ND11, a first delay unit DL1 that delays the output of the second inverter IV11 for a predetermined time and outputs a first column selection signal CY<i>, a second NAND gate ND12 that receives the column control signal YAE and the column address CA<2>, a third inverter IV12 that receives an output of the second NAND gate ND12, and a second delay unit DL2 that delays an output of the third inverter IV12 for a predetermined time and outputs a second column selection signal CY<j>.

The column control unit 120 shown in FIG. 4 generates the first column selection signal CY<i> at a high level while the column control signal YAE is at a high level and the column address CA<2> is at a low level. Further, the column control unit 120 generates the second column selection signal CY<j> at a high level while the column control signal YAE is at a high level and the column address CA<2> is at a high level.

In the related art, every small section necessarily includes a local IO line, a column control unit, an IOSA and a global IO line. However, according to the configuration of the present embodiment, two small sections share a local IO line, a column control unit, an IOSA, and a global IO line. Therefore, the area for the local IO line, the column control unit, the IOSA, and the global IO line in the present embodiment is half of conventional apparatus.

Figure 5:
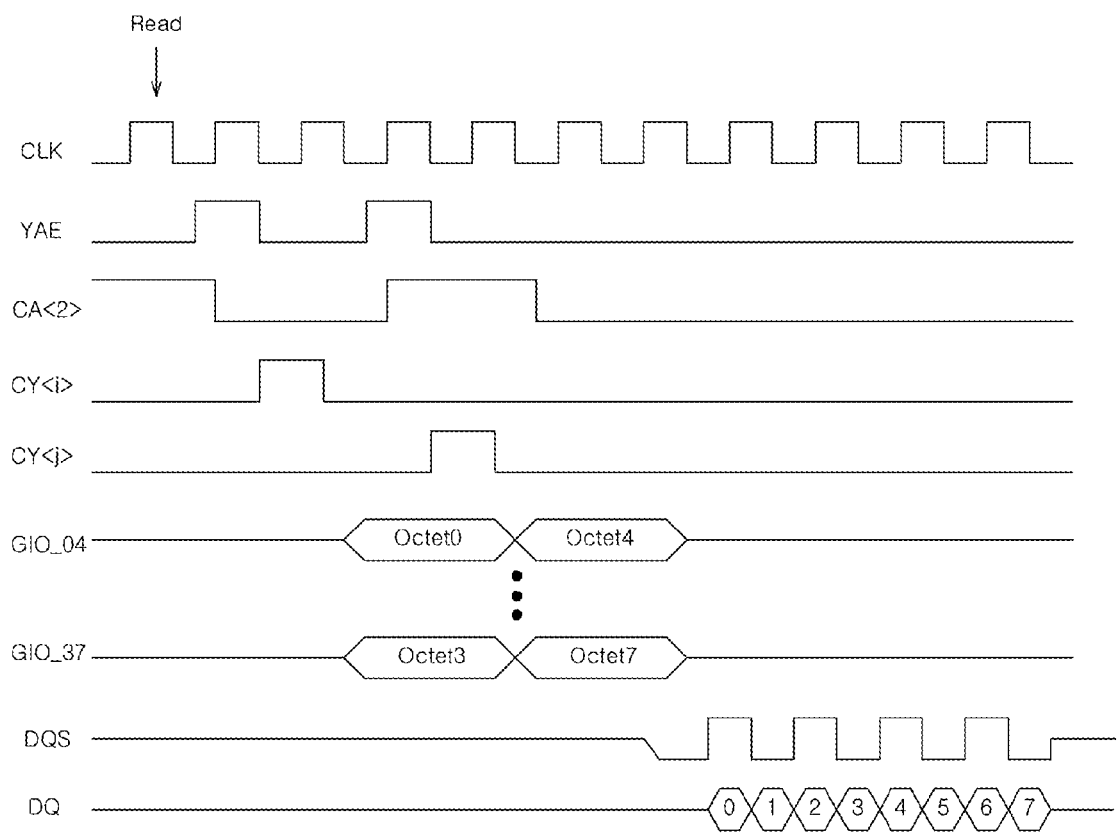
FIG. 5 is an operation timing chart illustrating the operation of the semiconductor memory apparatus of FIG. 3 in accordance with one embodiment.

Hereinafter, the operation of the semiconductor memory apparatus according to the present embodiment will be described with reference to FIG. 5.

When a read command Read is input, the column control signal YAE is generated after lapse of a predetermined time. The column control signal YAE is generated twice at a low level period and a high level period of the column address CA<2>.

When the first column control signal YAE is generated, the column control unit 120 of each of the first to fourth small section pairs Octet0/Octet4, Octet1/Octet5, Octet2/Octet6, and Octet3/Octet7 outputs a first column selection signal CY<i> to a first sell area 11-1 so as to correspond to the low level period of the column address CA<2>.

In response to the first column selection signal CY<i>, in half small sections Octet0, Octet1, Octet2, and Octet3 among first to fourth small section pairs Octet0/Octet4, Octet1/Octet5, Octet2/Octet6, and Octet3/Octet7, data recorded on the first cell area 11-1 is transmitted to the global IO lines GIO_04, GIO_15, GIO_26, and GIO_37 through the local IO line LIOT/LIOB and the IOSA 130 for two clocks.

When the second column signal YAE is generated, the column control unit 120 of each of the first to fourth small section pairs Octet0/Octet4, Octet1/Octet5, Octet2/Octet6, and Octet3/Octet7 outputs a second column selection signal CY<j> to a second sell area 11-2 so as to correspond to the high level period of the column address CA<2>.

In response to the second column selection signal CY<j>, in the remaining small sections Octet4, Octet5, Octet6, and Octet7 among first to fourth small section pairs Octet0/Octet4, Octet1/Octet5, Octet2/Octet6, and Octet3/Octet7, data recorded on the second cell area 11-2 is transmitted to the global IO lines GIO_04, GIO_15 GIO_26 and GIO_37 through the local IO line LIOT/LIOB and the IOSA 130 for two clocks.

The data of all of the small sections Octet0 to Octet7 is loaded on the global IO lines GIO_04, GIO_15, GIO_26, and GIO_37 within four outside clocks 4CLK. According to certain embodiments, for two clocks 2CLK of four clocks 4CLK, the data of small sections Octet0, Octet1, Octet2, and Octet3, which are half of the entire small sections is loaded on the global IO lines GIO_04, GIO_15, GIO_26, and GIO_37. Further, for the last two clocks 2CLK, the data of the remaining small sections Octet4, Octet5, Octet6, and Octet7 is loaded on the global IO lines GIO_04, GIO_15, GIO_26, and GIO_37.

The data of the global IO lines GIO_04, GIO_15, GIO_26, and GIO_37 is output to the outside of the semiconductor memory apparatus through a pad (not shown) on the basis of a strobe signal DQS.

Hereinafter, a semiconductor memory apparatus according to another embodiment will be described with reference to accompanying drawings.

Figure 6:
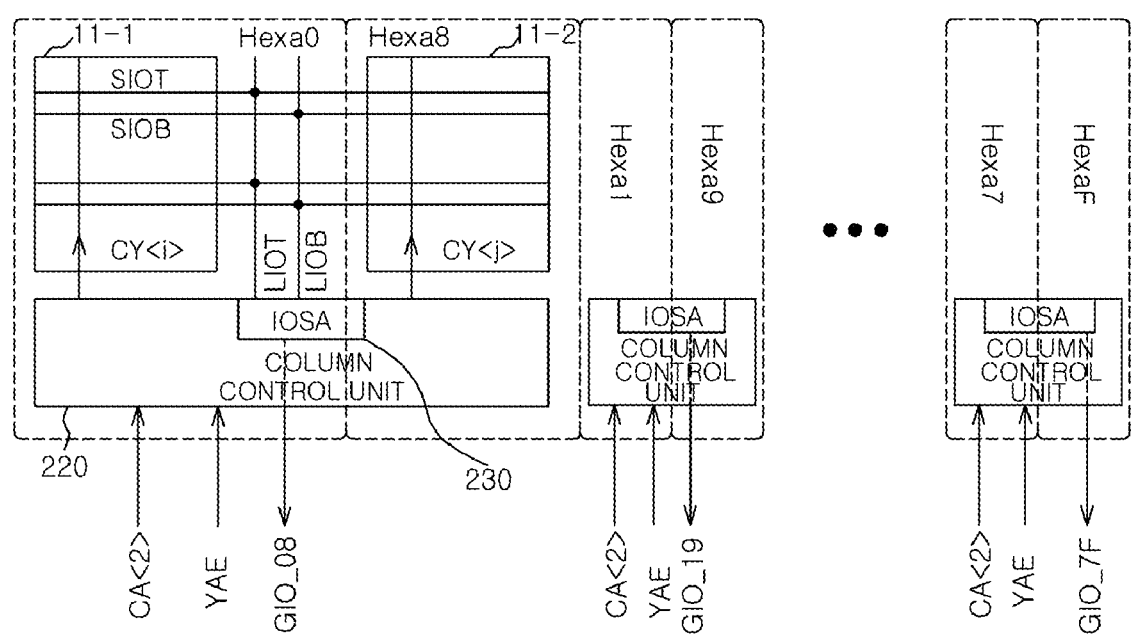
FIG. 6 is a block diagram illustrating a semiconductor memory apparatus according to another embodiment.

As shown in FIG. 6, the semiconductor memory apparatus according to this other embodiment includes a bank that is divided into 16 small sections Hexa0 to HexaF.

Every two small sections among the small sections Hexa0 to HexaF form pairs and share a local IO line LIOT/LIOB, a column control unit 220, an IOSA 230, and a global IO line GIO_08, GIO_19, GIO_2A, GIO_3B, GIO_4C, GIO_5D, GIO_6E, or GIO_7F.

Among small sections Hexa0 to HexaF, two small sections that make a pair are referred to as a small section pair. Since the small sections are 16, first to eight small section pairs Hexa0/Hexa8, Hexa1/Hexa9, Hexa2/HexaA, Hexa3/HexaB, Hexa4/HexaC, Hexa5/HexaD, Hexa6/HexaE, and Hexa7/HexaF are defined by every two adjacent small sections.

In order to form one pair by two of small sections Hexa0 to HexaF, the small sections that form the pair need to have a time difference of four clocks CLK when reading or writing data in the two small sections. Therefore, the first to eighth small section pairs are defined as Hexa0/Hexa8, Hexa1/Hexa9, Hexa2/HexaA, Hexa3/HexaB, Hexa4/HexaC, Hexa5/HexaD, Hexa6/HexaE, and Hexa7/HexaF.

The reference symbols of the global IO lines GIO_08, GIO_19, GIO_2A, GIO_3B, GIO_4C, GIO_5D, GIO_6E, and GIO_7F are named after the small sections that the pair shares. For example, the global IO line GIO_08 is named based on the number 0 of the small section Hexa0 and the number 8 of the small section Hexa8.

The global IO lines GIO_08, GIO_19, GIO_2A, GIO_3B, GIO_4C, GIO_5D, GIO_6E, and GIO_7F are connected to IO sense amplifiers 230 of the first to eighth small section pairs Hexa0/Hexa8, Hexa1/Hexa9, Hexa2/HexaA, Hexa3/HexaB, Hexa4/HexaC, Hexa5/HexaD, Hexa6/HexaE, and Hexa7/HexaF.

Since the first to eighth small section pairs Hexa0/Hexa8, Hexa1/Hexa9, Hexa2/HexaA, Hexa3/HexaB, Hexa4/HexaC, Hexa5/HexaD, Hexa6/HexaE, and Hexa7/HexaF have the same configuration, the configuration of the first small section pair Hexa0/Hexa8 will be described hereinafter as a representative.

The first small section pair Hexa0/Hexa8 includes first and second cell areas 11-1, and 11-2, a local IO line LIOT/LIOB, a column control unit 220, and an IOSA 230.

The local IO line LIOT/LIOB is connected with both internal IO lines SIOT/SIOB of the first small section pairs Hexa0/Hexa8.

The IOSA 230 is connected to the local IO line LIOT/LIOB and detects and amplifies the data of the local IO line LIOT/LIOB and then transmits to the global IO line GIO_08.

The column control unit 220 receives a column control signal YAE and a column address CA<2> and generates first and second column selection signals CY<i> and CY<j> at different times. The column address CA<2> is used to select the small sections Hexa0 to 7 and the small sections Hexa8 to F. Specifically, if the small sections Hexa0 to 7 are selected, the column address CA<2> is in a low level (a logical value is 0). Further, if the small sections Hexa8 to F are selected, the column address CA<2> is in a high level (a logical value is 1).

Since the column control unit 220 has the same configuration as the column control unit 120 shown in FIG. 4, the description of the column control unit 220 will be omitted.

According to this embodiment, two small sections share a local IO line, a column control unit, an IOSA, and a global IO line. Therefore, the area for the local IO line, the column control unit, the IOSA, and the global IO line in the present embodiment is half the area as in a conventional apparatus. Further, according to the embodiment shown in FIG. 6, the bank is divided into 16 small sections Hexa0 to HexaF, which has an advantage in that the area is half the area of the embodiment shown in FIG. 3 in which a bank is divided into eight small sections Octet0 to Octet7. As a result, as the degree of integration for semiconductor memory apparatus improves, the circuit area required can be reduced.

Figure 7:
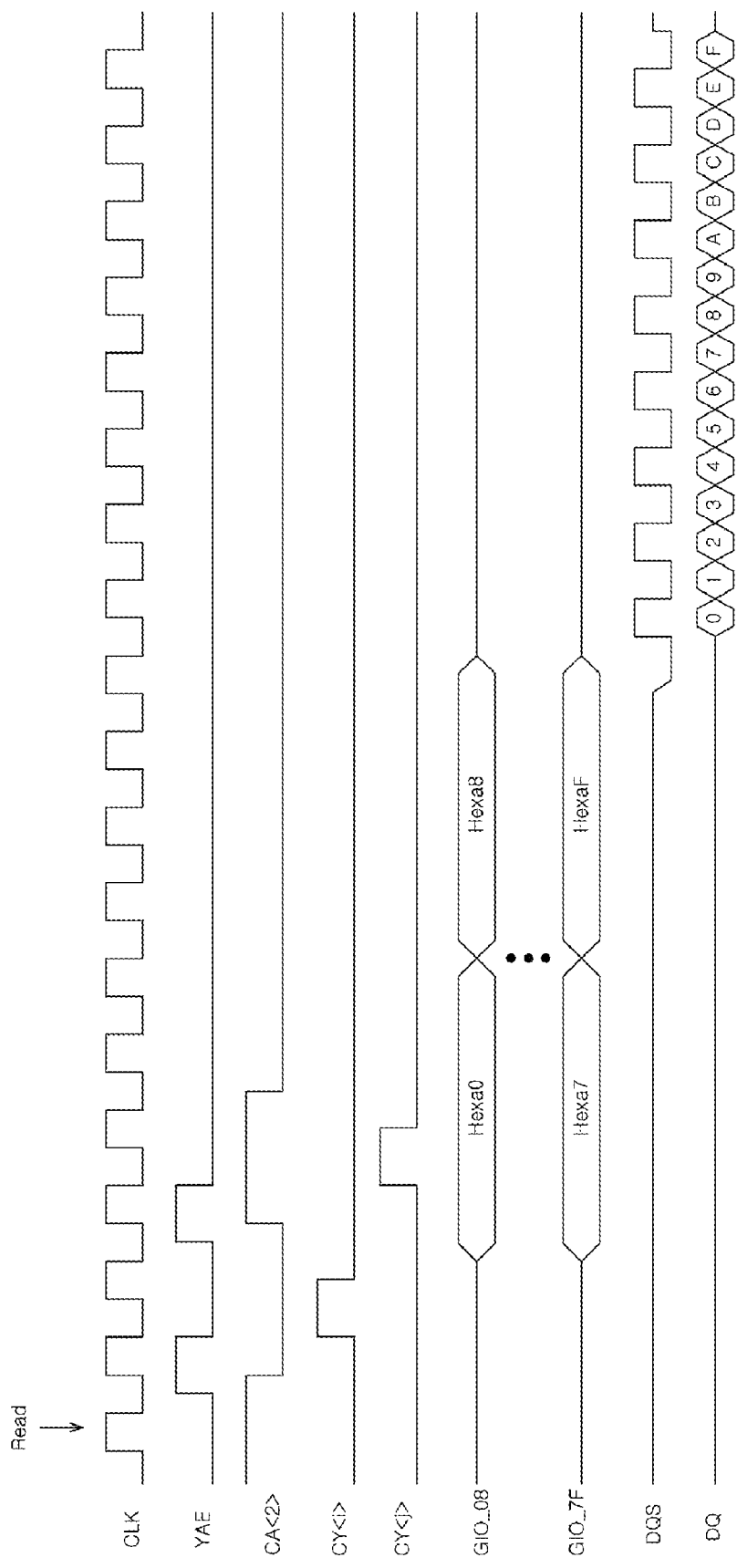
FIG. 7 is an operation timing chart illustrating the operation of the semiconductor memory apparatus of FIG. 6 according to one embodiment.

Hereinafter, the operation of the semiconductor memory apparatus according to the present embodiment will be described with reference to FIG. 7.

When a read command Read is input, the column control signal YAE is generated after lapse of a predetermined time. The column control signal YAE is generated twice at a low level period and a high level period of the column address CA<2>.

When the first column control signal YAE is generated, the column control unit 220 of each of the first to eighth small section pairs Hexa0/Hexa8, Hexa1/Hexa9, Hexa2/HexaA, Hexa3/HexaB, Hexa4/HexaC, Hexa5/HexaD, Hexa6/HexaE, and Hexa7/HexaF outputs a first column selection signal CY<i> to a first sell area 11-1 so as to correspond to the low level period of the column address CA<2>.

In response to the first column selection signal CY<i>, in half small sections Hexa0, Hexa1, Hexa2, Hexa3, Hexa4, Hexa5, Hexa6, and Hexa7 among first to eighth small section pairs Hexa0/Hexa8, Hexa1/Hexa9, Hexa2/HexaA, Hexa3/HexaB, Hexa4/HexaC, Hexa5/HexaD, Hexa6/HexaE, and Hexa7/HexaF, data recorded on the first cell area 11-1 is transmitted to the global IO lines GIO_08, GIO_19, GIO_2A, GIO_3B, GIO_4C, GIO_5D, GIO_6E, and GIO_7F through the local IO line LIOT/LIOB and the IOSA 230 for four clocks CLK.

When the second column signal YAE is generated, the column control unit 220 outputs a second column selection signal CY<j> to a second sell area 11-2 so as to correspond to the high level period of the column address CA<2>.

In response to the second column selection signal CY<j>, in the remaining small sections Hexa8, Hexa9, HexaA, HexaB, HexaC, HexaD, HexaE, and HexaF among first to eighth small section pairs Hexa0/Hexa8, Hexa1/Hexa9, Hexa2/HexaA, Hexa3/HexaB, Hexa4/HexaC, Hexa5/HexaD, Hexa6/HexaE, and Hexa7/HexaF, data recorded on the second cell area 11-2 is transmitted to the global IO lines GIO_08, GIO_19, GIO_2A, GIO_3B, GIO_4C, GIO_5D, GIO_6E, and GIO_7F through the local IO line LIOT/LIOB and the IOSA 230 for four clocks CLK.

The data of the global IO lines GIO_08, GIO_19, GIO_2A, GIO_3B, GIO_4C, GIO_5D, GIO_6E, and GIO_7F is output to the outside of the semiconductor memory apparatus through a pad (not shown) on the basis of a strobe signal DQS.

According to the semiconductor memory apparatus of this embodiment, the configurations of the signal lines and the input/output circuits may be reduced. Therefore, the layout margin is increased, and thus it is possible to easily make the circuit design and the layout design.

It will be apparent to those skilled in the art that various modifications and changes may be made without departing from the scope and spirit of the embodiments described herein. Therefore, it should be understood that the above embodiments are not limitative, but illustrative in all aspects. The scope of the present invention is defined by the appended claims rather than by the description preceding them, and therefore all changes and modifications that fall within metes and bounds of the claims, or equivalents of such metes and bounds are therefore intended to be embraced by the claims.

What is claimed is:

1. A semiconductor memory apparatus, comprising:
   a memory bank that is divided into a plurality of small sections;
   a plurality of the small sections being configured as small section pairs;
   a plurality of data input/output circuits, each of the plurality of data input/output circuits being configured to be shared by each respective small section pair, and configured to process data input/output of the small section pairs; and
   a plurality of signal lines, each of the plurality of signal lines being configured to be shared by respective small section pairs and configured to transmit the data of the respective small section pairs to the respective data input/output circuit or the outside of the memory bank.

2. The semiconductor memory apparatus of claim 1, wherein the small section forming small section pairs are arranged to be adjacent to each other.

3. The semiconductor memory apparatus of claim 1, wherein the data processing of the small section pairs is processed using different timing.

4. The semiconductor memory apparatus of claim 1, wherein each of the plurality of data input/output circuits includes:
   a control unit configured to control data output from the memory areas of the small section pairs using a column address; and
   a detecting and amplifying unit configured to detect and amplify the data output through the signal line from the memory areas of the small section pairs.

5. The semiconductor memory apparatus of claim 4, wherein the column address is an address for selecting the half of the plurality of small sections.

6. The semiconductor memory apparatus of claim 1, wherein the data input/output circuit is configured to input/output data simultaneously by a group of one small section of each the small section pairs during one half of a specified time defined for a data input/output command, and input/output data simultaneously by a group of the other small section of each the small section pairs during another half of the specified time.

7. The semiconductor memory apparatus of claim 4, wherein the control unit includes: a logic circuit configured to compound a column control signal and a column address to generate and output a first column control signal and a second column control signal to a first small section and a second small section that make up the corresponding small section pair.

8. The semiconductor memory apparatus of claim 4, wherein the control unit includes:
   a first logic circuit configured to perform a logic product of a column control signal and a column address; and
   a second logic circuit configured to perform a logic product of the column control signal and an inversed column address.

9. The semiconductor memory apparatus of claim 1, wherein the signal line includes:
   a local IO line that connects a first small section and a second small section of the small section pairs to the data input/output circuit; and
   a global IO line that connects the data input/output circuit to a peripheral circuit of the semiconductor memory apparatus.

* * * * *